(12) United States Patent
Agmon

(10) Patent No.: US 7,249,332 B1
(45) Date of Patent: Jul. 24, 2007

(54) USING LOCAL REDUCTION IN MODEL CHECKING TO IDENTIFY FAULTS IN LOGICALLY CORRECT CIRCUITS

(75) Inventor: Nimrod Agmon, Givat Chaim Meucad (IL)

(73) Assignee: Marvell Semiconductor Israel Ltd., Yokneam (IL)

(*) Notice: Subject to any disclaimer, the term of this patent is extended or adjusted under 35 U.S.C. 154(b) by 336 days.

(21) Appl. No.: 10/898,707

(22) Filed: Jul. 22, 2004

(51) Int. Cl.
*G06F 17/50* (2006.01)

(52) U.S. Cl. .............................................. 716/5; 716/4
(58) Field of Classification Search ................. 716/4–5
See application file for complete search history.

(56) References Cited

U.S. PATENT DOCUMENTS

| | | | |
|---|---|---|---|
| 6,665,848 B2 * | 12/2003 | Ben-David et al. ............ 716/5 |
| 6,715,107 B2 | 3/2004 | Beer et al. | |
| 6,728,939 B2 | 4/2004 | Johannsen | |
| 6,738,955 B2 | 5/2004 | Andersen et al. | |
| 6,957,404 B2 * | 10/2005 | Geist et al. .................... 716/4 |

\* cited by examiner

*Primary Examiner*—Jack Chiang
*Assistant Examiner*—Brandon Bowers

(57) ABSTRACT

A method and computer program for verifying a design of a circuit comprises selecting a portion of a model of the design having a plurality of inputs and outputs; providing a property for the design that defines a predetermined behavior of one or more of the outputs; determining whether a stimulus exists that, when applied to the inputs of the portion, can produce a behavior other than the predetermined behavior at the outputs of the portion; when the stimulus exists, determining whether the model of the design of the circuit can produce the stimulus at the inputs of the portion of the model of the circuit; and when the stimulus cannot be produced by the model of the design of the circuit at the inputs of the portion of the model of the circuit, preserving a description of the stimulus for analysis.

21 Claims, 3 Drawing Sheets

USING LOCAL REDUCTION IN MODEL CHECKING TO IDENTIFY FAULTS IN LOGICALLY CORRECT CIRCUITS

BACKGROUND

The present invention relates generally to hardware verification for electronic circuit designs. More particularly, the present invention relates to using local reduction in model checking to identify faults in logically correct circuits.

Recent advances in the design of application specific integrated circuits (ASIC) and system-on-chip (SoC) circuits are producing circuit designs of rapidly increasing complexity. These designs are driving the search for techniques that are capable of verifying such complex designs.

One commonly-used verification technique is model checking, which employs exhaustive mathematical techniques to prove whether a property holds true for a given design. A model checker uses a model of the design to consider all possible input combinations, and covers all possible reachable states to verify a property of the design. This is possible due to efficient techniques such as symbolic model checking and Binary Decision Diagram (BDD) representation used in model checking tools that allow analysis of sets of states simultaneously, and only consider the logic in the cone of influence of the property the tool is verifying.

However, conventional model checking tools verify only the logical design of a circuit. A circuit that is logically correct can still fail due to problems with timing, crosstalk, and other electrical anomalies. Conventional model checking tools are unable to detect such failures.

SUMMARY

In general, in one aspect, the invention features a method and computer program for verifying a design of a circuit. It comprises selecting a portion of a model of the design of the circuit, wherein the portion of the model of the circuit has a plurality of inputs and outputs; providing a property for the design, wherein the property defines a predetermined behavior of one or more of the outputs of the portion of the model of the design of the circuit; determining whether a stimulus exists that, when applied to the inputs of the portion of the model of the circuit, can produce a behavior other than the predetermined behavior at the one or more of the outputs of the portion of the model of the design of the circuit; when the stimulus exists, determining whether the model of the design of the circuit can produce the stimulus at the inputs of the portion of the model of the circuit; and when the stimulus cannot be produced by the model of the design of the circuit at the inputs of the portion of the model of the circuit, preserving a description of the stimulus for analysis.

Particular implementations can include one or more of the following features. Implementations comprise outputting the description of the stimulus. Implementations comprise generating a counterexample describing states of the portion and the further portion of the model of the design for one or more cycles. Implementations comprise outputting the counterexample. Implementations comprise selecting a further portion of the model of the design of the circuit, wherein the further portion of the model of the circuit has a plurality of inputs and outputs, and wherein at least one of the outputs is provided to at least one of the inputs of the portion of the model of the circuit; determining whether a further stimulus exists that, when applied to the inputs of the further portion of the model of the circuit, can produce a behavior other than the predetermined behavior at the one or more of the outputs of the portion of the model of the design of the circuit; when the further stimulus exists, determining whether the model of the design of the circuit can produce the further stimulus at the inputs of the further portion of the model of the circuit; and when the further stimulus cannot be produced by the model of the design of the circuit at the inputs of the further portion of the model of the circuit, preserving a description of the further stimulus for analysis. Implementations comprise outputting the further description of the stimulus. Implementations comprise generating a further counterexample describing states of the portion and the further portion of the model of the design for one or more cycles. Implementations comprise outputting the further counterexample. Implementations comprise providing the model of the design of the circuit. Implementations comprise asserting that the portion of the model of the design of the circuit contains a fault when no stimulus exists that, when applied to the inputs of the portion of the model of the circuit, can produce a behavior other than the predetermined behavior at the one or more of the outputs of the portion of the model of the design of the circuit. The portion of the model of the design of the circuit is selected based on the property for the design. Implementations comprise a semiconductor verified by the method or computer program.

The details of one or more implementations are set forth in the accompanying drawings and the description below. Other features will be apparent from the description and drawings, and from the claims.

Figure 1:
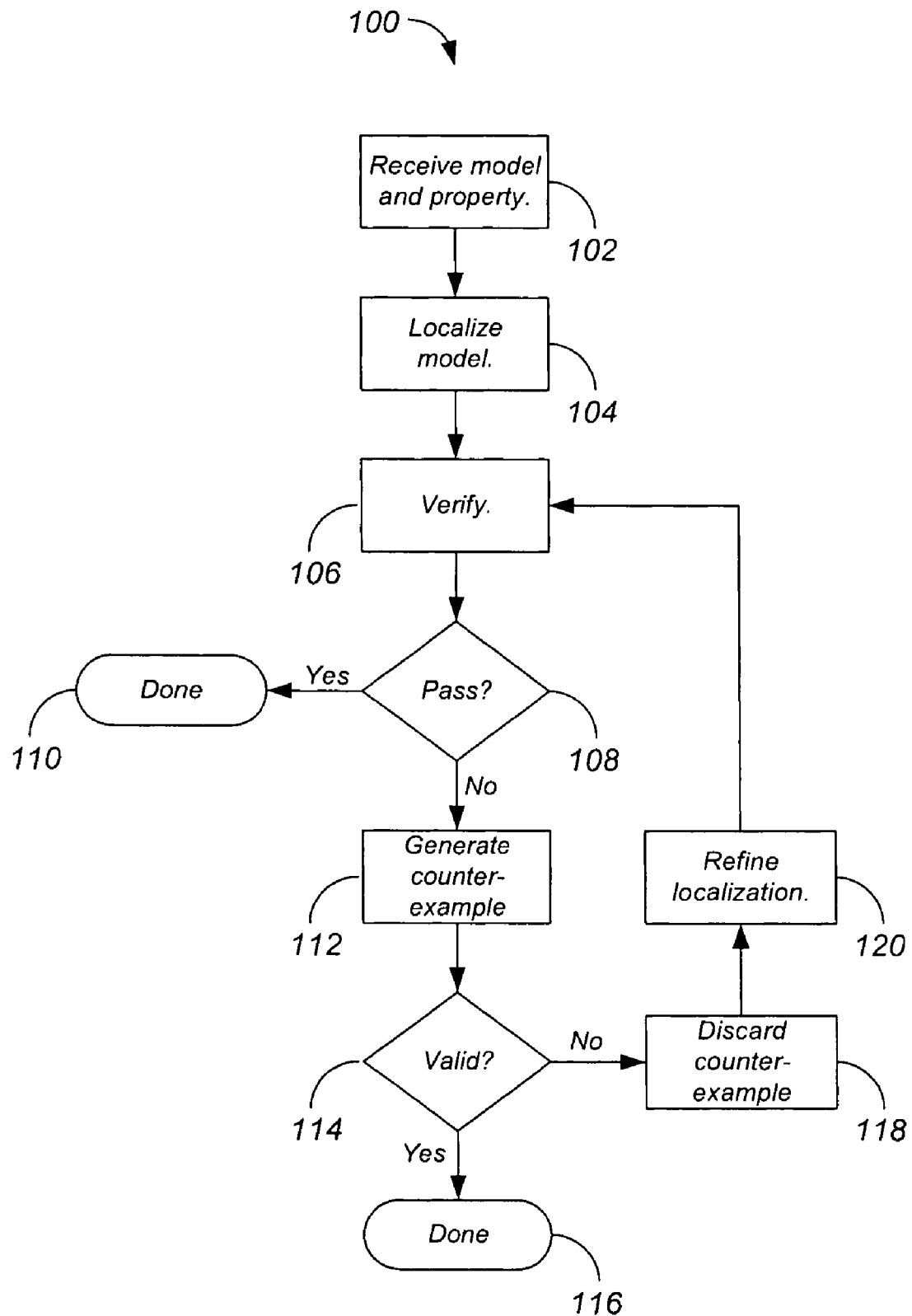
FIG. 1 shows a conventional process for a model checker using localization reduction.

The leading digit(s) of each reference numeral used in this specification indicates the number of the drawing in which the reference numeral first appears.

DETAILED DESCRIPTION

Formal verification is a name for a variety of methods used also for proving the correctness of electronic circuit designs. Given a formal description of a design, and a formal specification of its desired behavior, formal verification methods can be used to mathematically prove that the design complies with its specification. For example, formal verification can be used to prove that a cache control unit complies with specified cache coherency rules.

One family of formal verification tools is referred to as model checkers. A model checker is a software program that checks whether a model of the design satisfies a logical specification of the design. A model checker output is generally "pass" or "fail," stating whether the design satisfies the specification (pass) or not (fail). When a model checker output is "fail," it produces a "counterexample," which is a waveform that describes a fail. If no fails exist, the tool provides a "proof" that the design complies with its specification.

One problem with model checking is state explosion, which refers to the exponential increase in the number of states to be checked as the complexity of a design increases. One technique for coping with state explosion is local reduction, which is currently implemented in several commercially-available tools. In local reduction, only a small portion of a design model is checked. If the result is a pass, then the check is completed in a fraction of the time. If the result is a fail, a counterexample is generated. However, because the inputs to the portion of the design checked are not constrained to logically possible values, the counterexample may not be valid. If the counterexample is not valid, the portion of the design model is refined to include more of the design model, and re-checked. In general, this logical reduction process can produce a pass or a valid counterexample without checking the entire design model, and in a fraction of the time needed to do so.

The time spent by conventional local reduction model checking tools in generating invalid counterexamples is generally considered a waste. However, the inventors have found a use for these invalid counterexamples, as described in detail below. In particular, these invalid counterexamples, which are currently discarded because they could not possibly represent a valid logical operation of the circuit being checked, may represent a fault caused by an electrical problem in an electronic circuit.

Of course, while described in terms of electronic circuits, the techniques disclosed herein are equally applicable to other sorts of logic circuits, such as optical logic circuits and the like.

FIG. 1 shows a conventional process 100 for a model checker using localization reduction. The model checker receives a model of the design of a circuit and a property for verification (step 102). The model checker localizes the model of the design based on the property (step 104). That is, the model checker selects a portion of the model.

The model checker then verifies the property using the selected portion of the model (step 106). If the result of the verification is "pass" (step 108), then verification process 100 is done (step 110). However, if the result of the verification is "fail" (step 108), then the model checker generates a counterexample (step 112).

The model checker then determines whether the counterexample is valid (step 114). If the counterexample is valid, then process 100 is done (step 116). However, if the counterexample is not valid, the model checker discards the counterexample (step 118).

The model checker then refines the localization (step 120), and resumes process 100 at the verification step (step 106). The model checker then verifies the refined localization (step 106). Process 100 repeats in this way until a valid counterexample is found, or the program runs out of memory or time (step 114).

Figure 2:
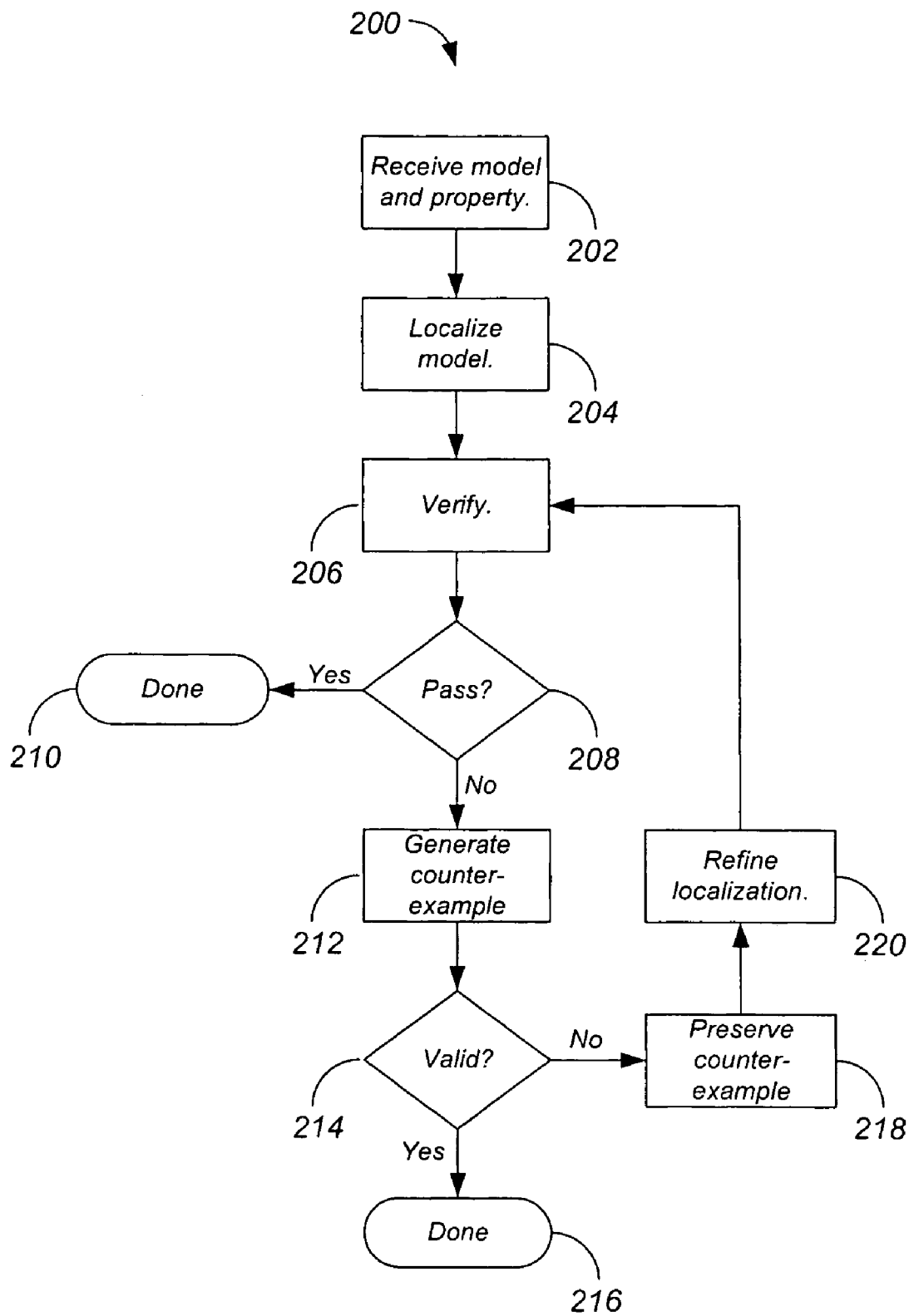
FIG. 2 shows a process for a model checker using local reduction according to a preferred embodiment of the present invention.

FIG. 2 shows a process 200 for a model checker using local reduction according to a preferred embodiment of the present invention. As mentioned above, the model checker can be obtained as commercially-available software, and can execute on a general-purpose or special-purpose computer.

The model checker receives a model of the design of a circuit and a property for verification (step 202). The model is a description of the design, and is preferably provided as a register-transfer-level (RTL) specification, although other descriptions can be used. The property is a description of an intended behavior of the design. For example, the property can specify that a buffer overflow can never occur. Properties are conventionally derived from the design specification for the circuit. The property is preferably provided in a language such as Property Specification Language (PSL), Sugar, or the like.

Figure 3:
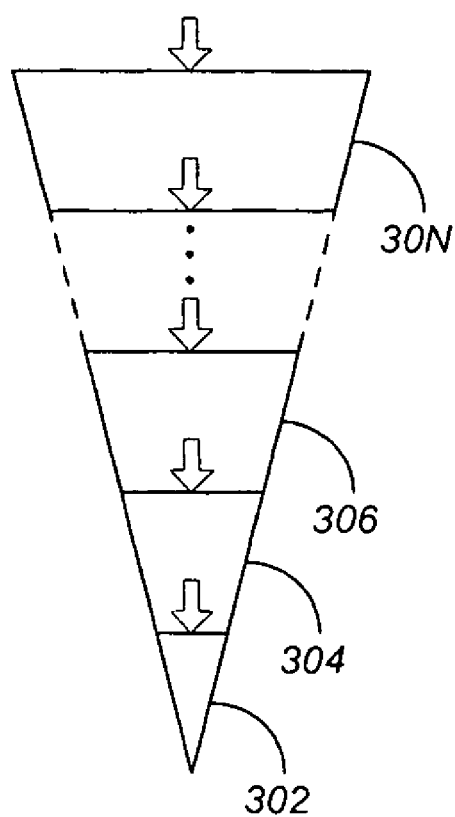
FIG. 3 illustrates the relationship between a model and portions of the model selected by the model checker.

The model checker localizes the model of the design based on the property (step 204). That is, the model checker selects a portion of the model. For example, if the property to be verified is that a bus in the circuit is not violated, the model checker could select only those circuits that provide outputs to the bus. Thus the property defines a predetermined behavior of one or more of the outputs of the portion of the model. FIG. 3 illustrates the relationship between a portion 302 selected by the model checker and a model 300.

The model checker then verifies the property using portion 302 of model 300 (step 206). That is, the model checker determines whether a stimulus exists that, when applied to the inputs of portion 302 of model 300, can produce a behavior other than the predetermined behavior defined by the property at the outputs of the portion 302 of model 300. For example, the model checker generates a verification model representation based on the model 300 and the property to be verified. The verification model representation can be states and transitions relations represented in a BDD data structure and the model checker is a Symbolic Model Verifier (SMV) engine, although other techniques can be used.

If the result of the verification is "pass" (step 208), then verification process 200 is done (step 210). This means portion 302 of the circuit is sufficient for the circuit to comply with the specification, that is, no electrical fault in the boundary of portion 302 could have caused the fault we are looking for and therefore, any electrical fault must reside inside portion 302. This is very helpful in narrowing the search for the fault. In some embodiments, process 200 then asserts that a fault exists in portion 302.

However, if the result of the verification is "fail" (step 208), then the model checker generates a counterexample (step 212). The "fail" result indicates that a stimulus exists that, when applied to the inputs of portion 302 of model 300, can produce a behavior other than the predetermined behavior defined by the property at the outputs of portion 302 of model 300. The counterexample describes states of the portion 302 of model 300 for one or more cycles. For example, the counterexample can include a trace of the waveforms for each input, output, and internal signal for several cycles leading up to the fail state.

The model checker then determines whether the counterexample is valid (step 214). That is, the model checker determines whether model 300 can produce the stimulus at the inputs of portion 302 of model 300. If the counterexample is valid, then process 200 is done (step 216). This means a logical fault has been found rather than an electrical fault.

However, if the counterexample is not valid, meaning the stimulus cannot be produced by model 300 at the inputs of portion 302, the model checker, instead of discarding the counterexample, preserves the counterexample (step 218), or at least preserves a description of the stimulus, for further analysis.

The model checker then refines the localization (step 220), and resumes process 200 at the verification step (step 206). To refine the localization, the model checker increases the scope of the portion of the model being verified in order to increase the likelihood of finding a valid counterexample. For example, referring to FIG. 3, the model checker selects a second portion 304 of model 300 having at least one output that is provided as an input to portion 302.

The model checker then verifies the refined localization (step 206) by determining whether a stimulus exists that, when applied to the inputs of portion 304 of the model of the circuit, can produce a behavior other than the predetermined behavior defined by the property at the outputs of portion 302 of model 300. Process 200 repeats in this way until a valid counterexample is found (step 214). That is, referring again to FIG. 3, if no valid counterexample is found using portion 304, the model checker refines the localization to include a portion 306 that includes circuits in the logic cone of portion 304, and so on with each iteration to include further portions 30N and, if necessary, the entire model 300. The model checker then outputs the preserved counterexamples for further analysis and testing.

The invalid counterexamples produced in this manner can be extremely useful in debugging a circuit because they represent sensitivities of the circuit to faults other than logical faults, such as electrical faults and the like. For example, the invalid counterexamples can be used to guide debugging a hardware implementation of the circuit, thus saving significant test time.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. An immediate application of embodiments of the present invention is in debug of hardware in the post-silicon phase. In this phase the debugger can not look into the internal behavior of the chip and can only monitor the behavior of the signals on the chip boundaries. In case that the chip violates any part of its logical specification, the debugger will have a trace of the bad scenario that violated the chip specification, but this trace will only show the signals on the chip boundaries. Now the debugger has to find which fault in the chip internal circuit could have caused such violation. The debugger can now phrase the violated specification in a specification description language such as PSL, take a description of the circuit in RTL, gate level or any other description, and employ the techniques described in this document to find the electrical fault. Accordingly, other implementations are within the scope of the following claims.

What is claimed is:

1. A method for verifying a design of a circuit, comprising:
   selecting a first portion of a model of the design, wherein the first portion has a plurality of first inputs and outputs;
   providing a property for the design, wherein the property defines a predetermined behavior of one or more of the first outputs;
   determining whether a first stimulus exists that, when applied to the first inputs, can produce a behavior other than the predetermined behavior at the one or more first outputs;
   when the stimulus exists, determining whether the model can produce the first stimulus at the first inputs; and
   when the stimulus cannot be produced by the model at the inputs, preserving a first description of the first stimulus for analysis.

2. The method of claim 1, further comprising:
   outputting the description.

3. The method of claim 1, further comprising:
   generating a counterexample describing states of the first portion and a further portion of the model for one or more cycles.

4. The method of claim 3, further comprising:
   outputting the counterexample.

5. The method of claim 1, further comprising:
   selecting a second portion of the model, wherein the second portion has a plurality of second inputs and outputs, and wherein at least one of the second outputs is provided to at least one of the first inputs;
   determining whether a second stimulus exists that, when applied to the inputs of, can produce a behavior other than the predetermined behavior at the one or more outputs of the first portion;
   when the second stimulus exists, determining whether the model can produce the second stimulus at the second inputs; and
   when the second stimulus cannot be produced by the model at the second inputs of the second portion, preserving a second description of the second stimulus for analysis.

6. The method of claim 5, further comprising:
   outputting the second description.

7. The method of claim 5, further comprising:
   generating a counterexample describing states of the first portion and the second portion for one or more cycles.

8. The method of claim 7, further comprising:
   outputting the counterexample.

9. The method of claim 1, further comprising:
   providing the model.

10. The method of claim 1, further comprising:
    asserting that the first portion contains a fault when no stimulus exists that, when applied to the first inputs, can produce a behavior other than the predetermined behavior at the one or more outputs.

11. The method of claim 1, wherein:
    the first portion is selected based on the property for the design.

12. A semiconductor verified by the method of claim 1.

13. A computer program stored on a tangible computer medium embodying instructions executable by a computer for verifying a design of a circuit, the computer program comprising:

selecting a first portion of a model of the design, wherein the first portion has a plurality of first inputs and outputs;

providing a property for the design, wherein the property defines a predetermined behavior of one or more of the first outputs;

determining whether a first stimulus exists that, when applied to the first inputs, can produce a behavior other than the predetermined behavior at the one or more first outputs;

when the first stimulus exists, determining whether the model can produce the first stimulus at the first inputs; and when the stimulus cannot be produced by the model at the first inputs, preserving a first description of the first stimulus for analysis.

14. The computer program of claim 13, further comprising:

generating a counterexample describing states of the first portion and a second portion of the model for one or more cycles.

15. The computer program of claim 13, further comprising:

selecting a second portion of the model, wherein the second portion has a plurality of second inputs and outputs, and wherein at least one of the second outputs is provided to at least one of the first inputs;

determining whether a second stimulus exists that, when applied to the second inputs, can produce a behavior other than the predetermined behavior at the one or more first outputs;

when the second stimulus exists, determining whether the model can produce the second stimulus at the second inputs; and when the second stimulus cannot be produced by the model at the second inputs, preserving a description of the second stimulus for analysis.

16. The computer program of claim 15, further comprising:

generating a counterexample describing states of the first portion and the second portion for one or more cycles.

17. The computer program of claim 13, further comprising:

providing the model.

18. The computer program of claim 13, further comprising:

asserting that the first portion contains a fault when no stimulus exists that, when applied to the first inputs, can produce a behavior other than the predetermined behavior at the one or more first outputs.

19. The computer program of claim 13, wherein:

the first portion is selected based on the property for the design.

20. A semiconductor verified by the computer program of claim 13.

21. A method for verifying a design of a circuit, comprising:

selecting a portion of a model of the design, wherein the portion has a plurality of inputs and outputs;

providing a property for the design, wherein the property defines a predetermined behavior of one or more of the outputs;

determining whether a stimulus exists that, when applied to the inputs, can produce a behavior other than the predetermined behavior at the one or more outputs;

determining whether the model can produce the stimulus at the inputs based on said stimulus existence determination; and preserving a description of the stimulus for analysis when the stimulus cannot be produced by the model.

* * * * *